United States Patent
Angyal et al.

(10) Patent No.: US 8,237,246 B2
(45) Date of Patent: Aug. 7, 2012

(54) DEEP TRENCH CRACKSTOPS UNDER CONTACTS

(75) Inventors: Matthew S. Angyal, Hopewell Junction, NY (US); Lawrence A. Clevenger, Hopewell Junction, NY (US); Vincent J. McGahay, Hopewell Junction, NY (US); Satyanarayana V. Nitta, Yorktown Heights, NY (US); Shaoning Yao, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 12/689,479

(22) Filed: Jan. 19, 2010

(65) Prior Publication Data
US 2010/0200960 A1    Aug. 12, 2010

Related U.S. Application Data

(60) Provisional application No. 61/151,961, filed on Feb. 12, 2009.

(51) Int. Cl.
*H01L 23/544* (2006.01)

(52) U.S. Cl. ........................................... 257/622

(58) Field of Classification Search ............. 257/620, 257/622
See application file for complete search history.

(56) References Cited

U.S. PATENT DOCUMENTS

| | | | |
|---|---|---|---|
| 6,261,945 | B1 | 7/2001 | Nye, III et al. |
| 6,951,801 | B2 | 10/2005 | Pozder et al. |
| 2006/0068567 | A1* | 3/2006 | Beyne et al. ............ 438/460 |
| 2006/0264035 | A1 | 11/2006 | Nogami |
| 2006/0278957 | A1* | 12/2006 | Lin et al. ............ 257/620 |
| 2007/0243490 | A1 | 10/2007 | Miyata |
| 2008/0277765 | A1* | 11/2008 | Lane et al. ............ 257/622 |

* cited by examiner

*Primary Examiner* — Thomas L Dickey
(74) *Attorney, Agent, or Firm* — Joseph P. Abate; Howard M. Cohn

(57) ABSTRACT

Deep trenches formed beneath contact level in a semiconductor substrate function as crackstops, in a die area or in a scribe area of the wafer, and may be disposed in rows of increasing distance from a device which they are intended to protect, and may be located under a lattice work crackstop structure in an interconnect stack layer. The deep trenches may remain unfilled, or may be filled with a dielectric material or conductor. The deep trenches may have a depth into the substrate of approximately 1 micron to 100 microns, and a width of approximately 10 nm to 10 microns.

16 Claims, 3 Drawing Sheets

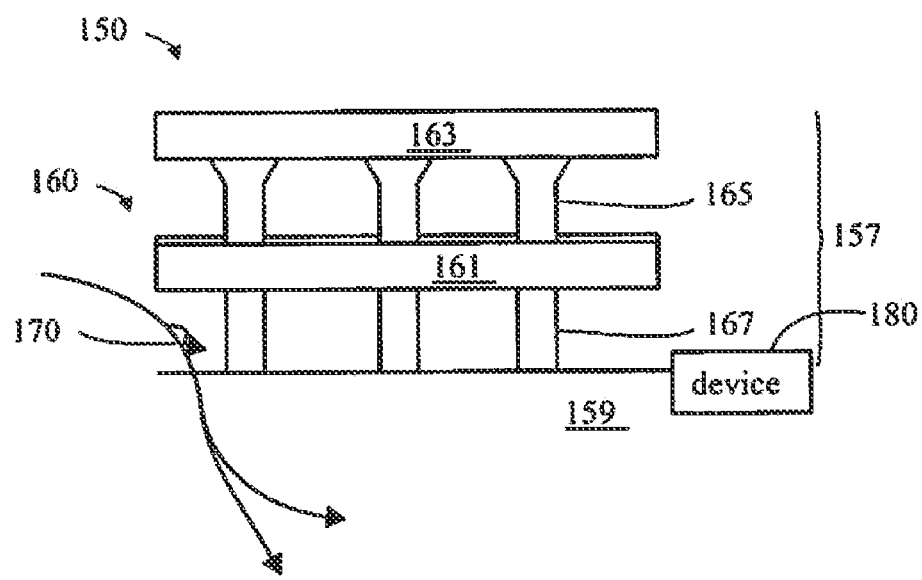
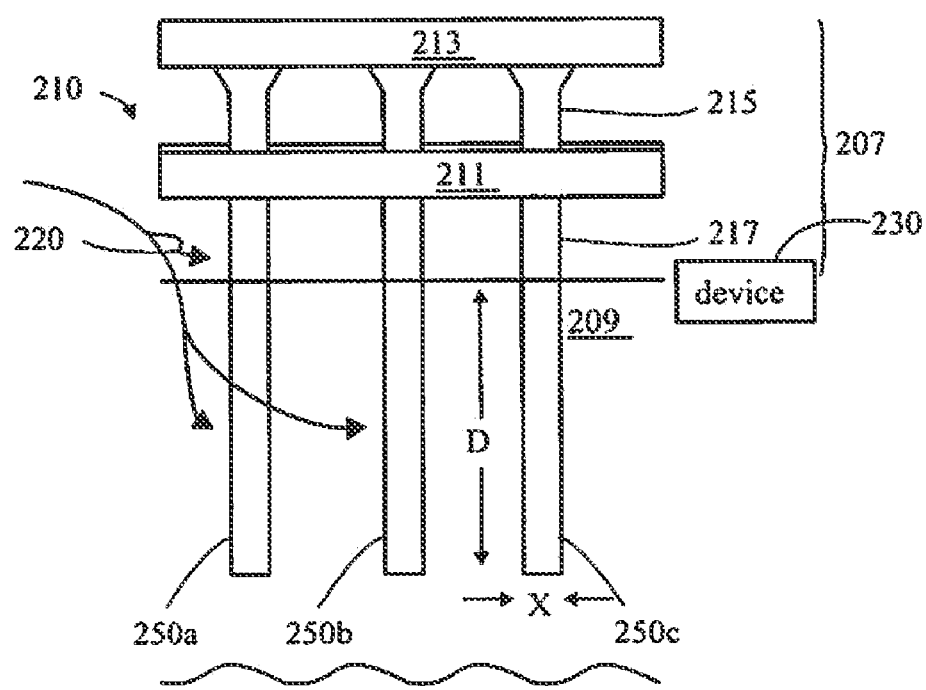

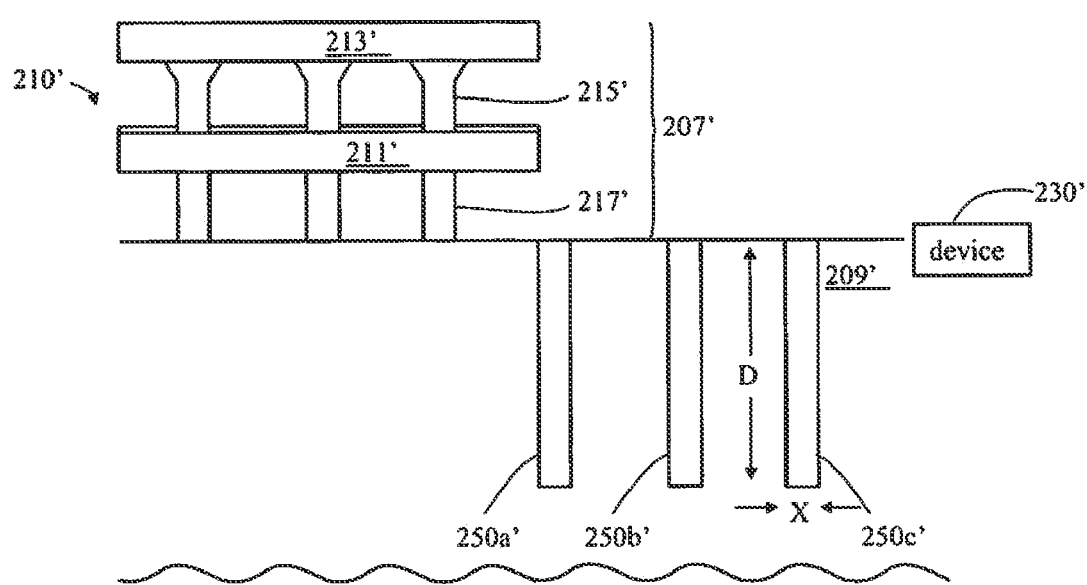

DEEP TRENCH CRACKSTOPS UNDER CONTACTS

This non-provisional application claims the benefit of the provisional application filed with the U.S. Patent and Trademark Office as Ser. No. 61/151,961 entitled "Deep Trench Crackstops Under Contacts", filed Feb. 12, 2009.

FIELD OF THE INVENTION

The invention relates to semiconductor device fabrication and, more particularly, to reducing cracks (structures for reducing cracks may be referred to as "crackstops") in semiconductor dies, such as cracks originating in a scribe area between semiconductor die areas of a wafer.

BACKGROUND OF THE INVENTION

FIG. 1A illustrates a conventional semiconductor wafer 100 comprising multiple die areas 102a, 102b, 102c and 102d. There may be many of these die areas on the wafer, although only four are shown here, for illustrative simplicity. The die areas (collectively referred to as "102") are typically arranged in an array, or grid pattern, with rows and columns of substantially identical die areas covering the surface of the wafer 100, and each die area 102 is typically rectangular.

Dies 102a and 102b are in a horizontal (as viewed) row, and dies 102c and 102d are in another horizontal row. Dies 102a and 102c are in a vertical (as viewed) column, and dies 102b and 102d are in another vertical column.

A horizontal (as viewed) scribe area 104h is shown between the row of dies 102a and 102b, and the row of dies 102c and 102d. And, a vertical (as viewed) scribe area 104v is shown between the column of dies 102a and 102c, and the column of dies 102b and 102d.

Horizontal and vertical saw paths 106h and 106v are shown within the scribe areas 104h and 104v, respectively. The scribe areas 104h and 104v may have a width "W" of approximately 100 μm (microns), and the saw paths 106h and 106v may have a width "w" of approximately 50 μm. Generally, the width of the saw path 106h or 106v corresponds to the width of a saw blade (not shown) plus tolerances (such as 5 μm) for alignment and placement. To singulate the die areas 102a-102d into separate dies (also called "dice"), the saw blade cuts through the wafer 100 along the saw paths 106h and 106v.

This sawing of the wafer imposes mechanical stress on the wafer, which essentially comprises crystalline silicon. Due to these mechanical stresses, cracks can originate in the saw path (or in the scribe area), and propagate into the die areas, causing device failures.

As described in greater detail hereinbelow, cracking due to the saw blade cutting through the saw path may be inhibited from propagating to die area by structures (113 and 115) which serve as crack stop trenches.

FIG. 1B illustrates a portion of a wafer 101 (compare 100) prior to the formation of solder balls (or the formation of other die-to-package external conductive connection structures in other embodiments). A die area 105 of wafer 101 is a portion of wafer 101 from which a semiconductor die (not shown) is made. The wafer 101 typically includes multiple die areas 105 (compare die areas 102 in FIG. 1) separated by scribe areas (compare scribe areas 104h and 104v in FIG. 1).

FIG. 1B illustrates a portion of a scribe area 103 located adjacent to (to the left of, as viewed) the die area 105. A second die area (not shown) may be located to the left of scribe area 103. A semiconductor die fabricated in the die area 105 may, for example, be utilized in a flip chip configuration in a semiconductor package.

The wafer 101 includes an interconnect stack layer 107 located on top of a substrate 109. The stack layer 107 may include multiple layers of dielectric material and interconnecting electrical conductive structures such as vias and trench layers. These interconnecting electrically conductive structures are made of metal (e.g. copper, aluminum, silver, or gold) and electrically couple devices (not shown) formed in substrate 109 with external conductive connection structures such as e.g. solder balls. The multiple layers of interconnect stack layer 107 may be formed using single damascene processes or dual damascene process.

To singulate the die of a wafer, a saw blade (not shown) or other cutting device is used to separate the die areas (e.g. 105) from each other during the later stages of manufacture. A saw blade cuts the wafer at a saw path 111. Conductive structures 112 which are made of copper are located in saw path 111. These conductive structures may be utilized for testing and alignment guides during manufacture but typically are not electrically coupled to the devices formed in the substrate 109 of die area 105 and are not utilized during the operation of the die in its end use. During the singulation of the die, the copper of these conductive structures 112 in the saw path 111 may build up on the saw blade thereby causing problems during singulation.

The interconnect layer 107 comprises a passivation layer 121 which is formed of a dielectric passivation material such as silicon nitride. The passivation layer 121 is formed over the die areas e.g. 105 of wafer 101 and is utilized as a protective layer of the die area. Passivation layer 121 includes openings for coupling external conductive connection structures (e.g. solder balls) to electrically conductive pads (e.g. 131) in interconnect stack layer 107. A polyimide layer 124 is formed over die area 105 and may be utilized for stress relief and die protection. The polyimide layer 124 includes openings for coupling external conductive connection structures (e.g. solder balls) to electrically conductive pads (e.g. 131) in interconnect stack layer 107. A passivation layer 121 may be located over portions of the scribe area that do not include metals in the saw path that are to be removed.

An edge seal ring 119 and crack stop ring 117 extend around the perimeter of die area 105, in the interconnect stack layer 107. Theses structures are made of metal trenches with trench vias located in between the traces. Contact vias 120 of the seal ring 119 and crack stop ring 117 may be of a different material such as tungsten.

Conductive structures 113 and 115 are ring structures located on the edge of saw path 111 in stack layer 107 and surround die area 105. The saw blade may be 50 μm (microns) wide, and the scribe area may be 100 microns wide. And the structures 113 and 115 may be located 20 and 15 microns, respectively, from crack stop 117. The conductive structures 113 and 115 may be removed to form crack stop trenches in the interconnect stack layer 107.

Patents and Publications

US Patent Publication 20070243490, incorporated by reference herein, discloses prevention of plasma induced damage arising from etching of crack stop trenches in multi-layered low-k semiconductor devices. A method of fabricating a semiconductor device begins by forming a lower interconnection dielectric on a substrate and forming at least one active or passive device in the lower interconnection dielectric. An etch stop layer is formed on the lower interconnection dielectric and an interconnect stack layer is formed on the etch stop layer. At least one interconnect trench structure and at least one crack stop trench are etched in the interconnect stack layer while maintaining electrical isolation between the interconnect structure and the crack stop trench.

US Patent Publication 20060264035, incorporated by reference herein, discloses crack stop trenches in multi-layered low-k semiconductor devices. A method is provided for fabricating a semiconductor device. The method begins by forming on a substrate an interconnect stack layer that includes a plurality of layers with interconnecting metal overlying the substrate. After forming the interconnect stack layer, a crack stop trench is formed in the interconnect stack layer. Finally, the crack stop trench is filled with a prescribed material.

U.S. Pat. No. 6,951,801, incorporated by reference herein, discloses metal reduction in wafer scribe area. It further discloses a process for removing metal from a scribe area of a semiconductor wafer. The metal removed may include exposed metal in a saw path of the scribe area and the metal in a crack stop trench of the scribe area. In one example, copper is removed from the scribe area by wet etching the wafer. In one example, the wet etching process is performed after the removal of an exposed barrier adhesion layer on the wafer surface. Removal of the metal in the saw path may reduce the amount of metal buildup on a saw blade during singulation of the die areas of a wafer.

U.S. Pat. No. 6,261,945, incorporated by reference herein, discloses crackstop and oxygen barrier for low-K dielectric integrated circuits. A copper-interconnect, low-K dielectric integrated circuit has reduced corrosion of the interconnect when the crackstop next to the kerf is also used as the primary barrier to oxygen diffusion through the dielectric, with corresponding elements of the crackstop being constructed simultaneously with the circuit interconnect elements; e.g. horizontal interconnect elements have a corresponding structure in the crackstop and vias between interconnect layers have corresponding structures in the crackstop.

GLOSSARY

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

BEOL short for Back End of Line. BEOL operations are performed on the semiconductor wafer in the course of device manufacturing following first metallization (Ml). See FEOL.

CMOS short for complementary metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics.

DT short for deep trench. Deep trench (DT) process is known process for capacitors. A deep trench (DT) may, for example, have a depth "D" of approximately 2000-5000 nm (2-5 microns), a width "W" of approximately 50-175 nm, is much deeper than it is wide, having an aspect ratio (D:W) of approximately 40:1. A deep trench may be at least 10 times deeper than it is wide, including at least 20 times, 30 times or 40 times deeper than it is wide. In contrast to deep trench, a "shallow" trench may be only as deep as it is wide, having for example a 1:1 aspect ratio.

FEOL short for Front End of Line. FEOL operations are performed on the semiconductor wafer in the course of device manufacturing up to first metallization. See BEOL.

ILD short for inter-level (or inter-layer) dielectric. ILD may be a relatively thick layer of oxide deposited on completed underlying structures (such as FETs), which will support a layer(s) of metal lines interconnecting the various underlying structures. Holes (vias) may be etched through the ILD and filled with metal (typically aluminum or copper) to make contact with elements (such as source, drain, gate) of the underlying structures.

RIE short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is the most common etching mode in semiconductor manufacturing.

Si Silicon, a semiconductor.

SOI short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire.

STI short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI.

Substrate typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline.

Units of Length Various units of length may be used herein, as follows:

meter (m) A meter is the SI unit of length, slightly longer than a yard. 1 meter=~39 inches. 1 kilometer (km)=1000 meters=~0.6 miles. 1,000,000 microns=1 meter. 1,000 millimeters (mm)=1 meter.

100 centimeters (cm)=1 meter.

micron (μm) one millionth of a meter (0.000001 meter); also referred to as a micrometer.

mil ¹⁄₁₀₀₀ or 0.001 of an inch; 1 mil=25.4 microns. nanometer (nm) one billionth of a meter (0.000000001 meter). Angstrom (Å) one tenth of a billionth of a meter. 10 Å=1 nm.

wafer In microelectronics, a wafer is a thin slice of semiconductor material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

SUMMARY OF THE INVENTION

According to the invention, generally, deep trenches (DTs) are formed under the crackstop to prevent crack penetrating into substrate. This can reduce wafer cracking during dicing (or scribing).

This invention discloses using deep trenches as crackstop. They can be placed under conventional crackstop bars or any other place where they are needed. The deep trenches may prevent crack source propagating into wafer (Si) substrate and product area. This structure can reduce wafer cracking during dicing (or scribing).

According to an embodiment of the invention, a semiconductor wafer comprises: crackstop structures comprising deep trenches formed beneath contact level, in a scribe area of the wafer. An additional crackstop structure may comprise an interconnect stack layer disposed on the semiconductor substrate in the scribe area. The interconnect stack layer may comprise a lattice work of metal lines, vias between levels of the metal lines, and contacts extending from the metal lines to the substrate, and the lines, vias and contacts may be disposed in a dielectric material.

The deep trenches function as crackstops, and may remain unfilled. Or, they may be filled with a dielectric material or conductor. The deep trenches may have a depth into the substrate of approximately 1 micron to 100 microns, and a width of approximately 10 nm to 10 microns.

According to an embodiment of the invention, a semiconductor wafer comprises a plurality of deep trenches may disposed in the substrate and functioning as crackstop structures. The deep trenches may be located in a die area of the wafer or in a scribe area of the wafer.

The deep trenches may be disposed in rows of increasing distance from a device which they are intended to protect. The deep trenches may be located under a lattice work crackstop structure in an interconnect stack layer. The deep trenches and the lattice work crackstop structure may both be disposed in a scribe area of the wafer. The deep trenches may be disposed adjacent to and outside of a lattice work crackstop structure.

According to an embodiment of the invention, a method of preventing crack propagation comprises: providing deep trenches, formed beneath contact level, in a semiconductor substrate. The deep trenches may be provided in a die area or in a scribe area of the wafer, and may be disposed in rows of increasing distance from a device which they are intended to protect, and may be located under a lattice work crackstop structure in an interconnect stack layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
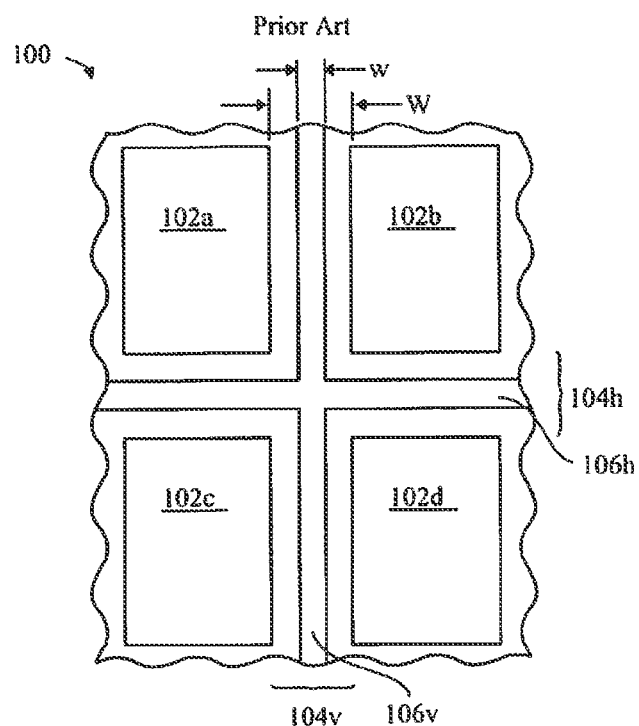

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. (An alternative to the "100's increment" may be a different increment, such as a "20's increment", where elements 120, 122 and 124 are comparable to elements 100, 102 and 104, for example.) Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1A is a partial, top plan view of a wafer, according to the prior art.

Figure 1B:
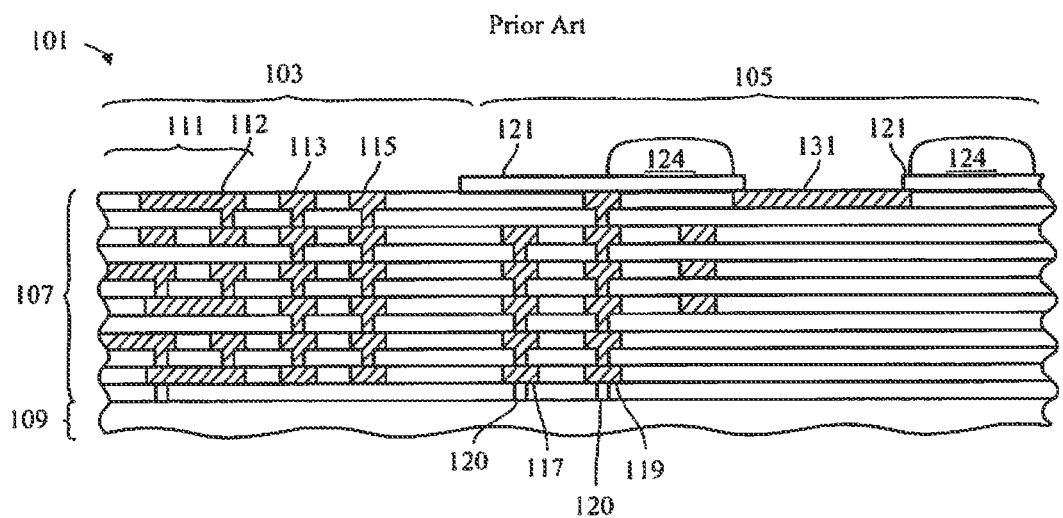

FIG. 1B is a partial, cross-sectional view of a semiconductor wafer during its manufacture according to the prior art.

FIG. 1C is a partial cross-sectional view of a chip, illustrating crack propagation, according to the prior art.

FIG. 2A is a partial cross-sectional view of a chip, illustrating an embodiment of using deep trenches to prevent propagation, according to the invention.

FIG. 2B is a partial cross-sectional view of a chip, illustrating an embodiment of using deep trenches to prevent propagation, according to the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As used herein, the term semiconductor fabrication or process or device may refer to standard CMOS processing and devices. CMOS is a widely used type of semiconductor product that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

FIG. 1C illustrates an example of crack propagation, according to the prior art. Generally, the crackstop structure shown in FIG. 1C is a "simplified" version of what was shown and discussed with respect to FIG. 1B.

FIG. 1B showed a wafer 101 having a scribe area 103 and a die area 105 adjacent the scribe area 103, and an interconnect stack layer 107 on a substrate 109. An edge ring seal 119 surrounds the die area, and a crack stop ring 117 surrounds the edge ring seal 119. Conductive structures 113 and 115 in the interconnect stack layer 107 may be removed to form crack stop trenches in the interconnect stack layer 107.

FIG. 1C shows a portion of a wafer 150 having an interconnect stack layer 157 (compare 107) on a semiconductor substrate 159 (compare 109). The bottom of the substrate 159 is omitted, for illustrative clarity.

The stack layer 157 may include multiple layers of dielectric material and interconnecting electrical conductive structures such as vias and trace (trench) layers. This interconnect stack layer 157 may be located in a scribe area (such as 103) or in a die area (such as 105) of the wafer 150. More generally, the interconnect stack layer 157 comprises a "lattice work" 160 of metal lines 161 and 163, vias 165 between levels of the metal lines, and contacts 167 extending from the metal lines to the substrate 159—all of these lines, vias and contacts disposed in a dielectric material, such as interlevel dielectric (ILD). The lattice work 160 does not extend into the substrate 159.

The lattice work 160 may be disposed in a scribe area (see 104$h$ and 104$v$) of the wafer. The operation of sawing the wafer to singulate dies imposes mechanical stress on the wafer and can result in cracks. A purpose of the lattice work 160 is to reduce the propagation of such cracks. (The lattice work functions as a crackstop structure.) For example, a crack 170 originating from the left (as viewed) of the lattice work 160 is illustrated as being "blocked" by the lattice work 160 in the interconnect stack layer 157, but may propagate under the lattice work 160, in the substrate 159, and may adversely affect devices (labeled "device" 180, and shown schematically) which would generally be to the right (as viewed) of the lattice work 160. (A device 180, such as a FET, is generally located principally in the substrate 159, although, for example, the gate stack of the FET will be located on the surface of the substrate.)

FIG. 2A shows a portion of a wafer 200 (compare 150) having an interconnect stack layer 207 (compare 157) on a semiconductor substrate 209 (compare 159). The bottom of the substrate 209 is shown as a wavy line at the bottom of the figure. The stack layer 207 may include multiple layers of dielectric material and interconnecting electrical conductive structures such as vias and trace (trench) layers. The interconnect stack layer 207 may be located in a scribe area (such as 103) or in a die area (such as 105) of the wafer 200. More generally, the interconnect stack layer 207 comprises a "lattice work" 210 (compare 160) of metal lines 211 and 213, vias 215 between levels of the metal lines, and contacts 217 extending from the metal lines to the substrate 209—all of these lines, vias and contacts disposed in a dielectric material, such as interlevel dielectric (ILD). The lattice work 210 does not extend into the substrate 219.

The lattice work 210 may be disposed in a scribe area (see 104$h$ and 104$v$) of the wafer. The operation of sawing the wafer to singulate dies imposes mechanical stress on the wafer and can result in cracks. A purpose of the lattice work 210 is to reduce the propagation of such cracks. (The lattice work functions as a crackstop structure.) For example, a crack 220 originating from the left (as viewed) of the lattice work 210 is illustrated as being "blocked" by the lattice work 210 in the interconnect stack layer 207, but may propagate under the lattice work 210, in the substrate 209, and may adversely affect devices (labeled "device" 230, and shown schematically) which would generally be to the right (as viewed) of the lattice work 210. (A device 230, such as a FET, is generally located principally in the substrate 209, although, for example, the gate stack of the FET will be located on the surface of the substrate.)

FIG. 2A illustrates an embodiment of the invention which comprises incorporating deep trenches to prevent crack propagation, according to the invention. As used herein, "prevent" means to reduce, including substantially reduce, and including the possibility of completely eliminating. The deep trenches function as crackstop structures.

Three deep trenches 250a, 250b and 250c (generally, "250") are shown. Each one represents many trenches which can be distributed, for example, in rows (or rings) of increasing distance around (from) a die area or device which they are intended to protect, forming successive "lines of defense" against cracks propagating into the die area. Note that the trench(es) 250c are closest to the device 280, the trench(es) 250b are further from the device 280, and the trench(es) 250a are farthest from the device 280 being protected against the propagation of cracks.

Generally, the deep trenches 250 can be located anywhere there is a concern about cracks propagating. In this example, the deep trenches 250 are located under a conventional crackstop structure 210 in the scribe area. Further, the deep trenches 250 are shown as being aligned with respective ones of the contacts 217. What is intended to be highlighted here is that the deep trenches 250 provide crackstop structures in the substrate 209 rather than in the interconnect stack layer 207, and can work (function) in conjunction with a conventional crackstop structure (lattice work 210) in the interconnect stack layer 207 to prevent cracks from propagating to devices. The title "Deep Trench Crackstops Under Contacts" is also intended to convey the fact that the crackstop structures (deep trenches 250) are beneath contact level, in the substrate, rather than at or above contact level (such as in the interconnect stack layer).

Notice that the crack 220, which propagated under the conventional crackstop 210, may be stopped by a first one of the deep trenches 250a, which forms what may be considered to be a first "line of defense". A crack may make it past or around the trenches 250a, and be stopped by a second row of trenches 250b.

The invention may advantageously utilize existing CMOS processes, which means that no extra masks or steps may be required. The deep trenches 250 may be formed by any suitable process, such as reactive ion etching (RIE).

The deep trenches (DTs) 250 may be left unfilled (such as "filled with air"), or they can be filled with materials such as dielectric or conductor. In general, the deep trenches 250 serve a mechanical function (crackstops), rather than an electrical one (such as capacitors).

The deep trenches (DTs) 250 may have a depth (into the substrate) of approximately 1 micron to 100 microns, and a width "X" of 10 nm to 10 microns. Generally, the trenches 250 are simply in the form of conventional deep trenches which would be used, for example, for forming capacitors.

It should be understood that the deep trench crack-stops may be adjacent to and outside the standard crack-stop which are in the interconnect levels as well. This is shown in FIG. 2B, wherein elements similar to those in FIG. 2A are similarly numbered (same numerals, but primed). The deep trench crack stops may be in the die area; while the conventional interconnect level crack stop is either in the die area or the scribe area.

In this manner, the deep trench crack stops 250' (250a', 250b', 250c') will form the first line of defense to prevent crack propagation into the interconnect. This can be important because as the industry is moving to higher performing but weaker dielectrics, the probability for cracks to propagate into the interconnect level despite the presence of conventional crack stops becomes higher. Thus, the present invention could prevent crack propagation into the interconnect levels as well.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor wafer comprising:
   a substrate;
   crackstop structures comprising a plurality of deep trenches formed in the substrate;
   an additional crackstop structure comprising an interconnect stack layer disposed on the substrate in a scribe area, wherein:
   the interconnect stack layer comprises a lattice work of metal lines, vias between levels of the metal lines, and a plurality of contacts extending from the metal lines to the substrate; and
   wherein each contact is disposed above a respective one of said plurality of deep trenches, and wherein each contact is aligned with its respective deep trench.

2. The semiconductor wafer of claim 1, wherein:
   the lines, vias and contacts are disposed in a dielectric material.

3. The semiconductor wafer of claim 1, wherein:
   the deep trenches are unfilled.

4. The semiconductor wafer of claim 1, wherein:
   the deep trenches have a depth into the substrate of approximately 1 micron to 100 microns, and a width of approximately 10 nm to 10 microns.

5. A semiconductor wafer comprising:
   a plurality of deep trenches disposed in the wafer and functioning as crackstop structures, wherein the deep trenches are located in the wafer under a lattice work crackstop structure in an interconnect stack layer, and wherein the interconnect stack layer comprises a plurality of contacts; and wherein each contact is disposed above a respective one of said plurality of deep trenches, and wherein each contact is aligned with its respective deep trench.

6. The semiconductor wafer of claim 5, wherein:
   the deep trenches are located in a die area of the wafer.

7. The semiconductor wafer of claim 5, wherein:
   the deep trenches are located in a scribe area of the wafer.

8. The semiconductor wafer of claim 5, wherein:
   the deep trenches are disposed in rows of increasing distance from a device which they are intended to protect.

9. The semiconductor wafer of claim 5, wherein:
the deep trenches and the lattice work crackstop structure are disposed in a scribe area of the wafer.

10. The semiconductor wafer of claim 5, wherein:
the deep trenches are unfilled.

11. The semiconductor wafer of claim 5, wherein:
the deep trenches are filled with a material.

12. The semiconductor wafer of claim 5, wherein:
the deep trenches are disposed adjacent to and outside of a lattice work crackstop structure.

13. A method of preventing crack propagation comprising:
providing a plurality of deep trenches, formed beneath contact level, in a semiconductor substrate;
locating the deep trenches under a lattice work crackstop structure in an interconnect stack layer, wherein the interconnect stack layer comprises a plurality of contacts, and wherein each deep trench is disposed below, and aligned with, a respective contact from the lattice work crackstop structure.

14. The method of claim 13, further comprising:
locating the deep trenches in a die area of the wafer substrate.

15. The method of claim 13, further comprising:
locating the deep trenches in a scribe area of the substrate.

16. The method of claim 13, further comprising:
disposing the deep trenches in rows of increasing distance from a device which they are intended to protect.

* * * * *